United States Patent
Hirashita et al.

(10) Patent No.: US 10,674,590 B2
(45) Date of Patent: Jun. 2, 2020

(54) TANK, TARGET GENERATION DEVICE, AND EXTREME-UV-LIGHT GENERATION DEVICE

(71) Applicant: Gigaphoton Inc., Tochigi (JP)

(72) Inventors: Toshiyuki Hirashita, Oyama (JP); Toshihiro Nishisaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/126,829

(22) Filed: Sep. 10, 2018

(65) Prior Publication Data
US 2019/0008026 A1 Jan. 3, 2019

Related U.S. Application Data

(63) Continuation of application No. PCT/JP2016/063474, filed on Apr. 28, 2016.

(51) Int. Cl.
*H05G 2/00* (2006.01)
*G03F 7/20* (2006.01)

(52) U.S. Cl.
CPC .......... *H05G 2/006* (2013.01); *G03F 7/70033* (2013.01); *H05G 2/005* (2013.01); *H05G 2/008* (2013.01)

(58) Field of Classification Search
CPC .......... H05G 2/006; H05G 2/00; H05G 2/005; H05G 2/008; G03F 7/70033
USPC ................................ 250/493.1, 494.1, 504 R
See application file for complete search history.

(56) References Cited

U.S. PATENT DOCUMENTS

| 5,520,142 A | 5/1996 | Ikeda et al. |
|---|---|---|
| 2007/0012251 A1 | 1/2007 | Zucker et al. |
| 2012/0085119 A1* | 4/2012 | Yokoyama .......... F04C 18/3564 62/296 |
| 2013/0205667 A1* | 8/2013 | Pontes ..................... B64C 3/34 49/70 |
| 2013/0240645 A1 | 9/2013 | Ishihara et al. |

(Continued)

FOREIGN PATENT DOCUMENTS

| JP | H07-15056 A | 1/1995 |
|---|---|---|
| JP | H07-273095 A | 10/1995 |
| JP | H09-31671 A | 2/1997 |

(Continued)

OTHER PUBLICATIONS

International Search Report issued in PCT/JP2016/063474; dated Aug. 2, 2016.

(Continued)

*Primary Examiner* — Nicole M Ippolito
(74) *Attorney, Agent, or Firm* — Studebaker & Brackett PC

(57) ABSTRACT

A tank may include: a tank main body having a space and an opening; a lid body covering the opening and a peripheral portion of the opening; a bolt for fixing the tank main body and the lid body in the peripheral portion; a first support portion arranged to surround the opening in a region on a side of the opening with respect to the bolt to support the lid body; a second support portion arranged to surround the opening in a region on the opening side with respect to the first support portion and having a height lower than a height of the first support portion; and a sealing member arranged to surround the opening in the region on the opening side with respect to the first support portion.

16 Claims, 11 Drawing Sheets

(56) References Cited

U.S. PATENT DOCUMENTS

2014/0255575 A1\* 9/2014 Bhushan ................. A23N 4/24
426/484
2015/0034479 A1\* 2/2015 Pan .......................... C25B 9/04
204/277

FOREIGN PATENT DOCUMENTS

| | | |
|---|---|---|
| JP | H11-2328 A | 1/1999 |
| JP | H11-315925 A | 11/1999 |
| JP | 2000-232246 A | 8/2000 |
| JP | 2005-330988 A | 12/2005 |
| JP | 2006-153169 A | 6/2006 |
| JP | 2007-187289 A | 7/2007 |
| JP | 2007-277667 A | 10/2007 |
| JP | 2009-500580 A | 1/2009 |
| JP | 2009-144735 A | 7/2009 |
| JP | 2011-031364 A | 2/2011 |
| JP | 2013-191699 A | 9/2013 |
| JP | 2014-114878 A | 6/2014 |
| JP | 2015-039040 A | 2/2015 |
| JP | 2015-218871 A | 12/2015 |

OTHER PUBLICATIONS

Written Opinion issued in PCT/JP2016/063474; dated Aug. 2, 2016.
An Office Action mailed by the Japanese Patent Office dated Mar. 10, 2020, which corresponds to Japanese Patent Application No. 2018-514080 and is related to U.S. Appl. No. 16/126,829.

\* cited by examiner

TANK, TARGET GENERATION DEVICE, AND EXTREME-UV-LIGHT GENERATION DEVICE

CROSS-REFERENCE TO RELATED APPLICATIONS

The present application is a continuation application of International Application No. PCT/JP2016/063474 filed on Apr. 28, 2016. The content of the application is incorporated herein by reference in its entirety.

BACKGROUND

1. Technical Field

The present disclosure relates to a tank, a target generation device, and an extreme-UV-light generation device.

2. Related Art

In recent years, according to miniaturization of a semiconductor process, miniaturization of transfer patterns in optical lithography of the semiconductor process has been rapidly progressed. In the next generation, microfabrication of equal to or less than 20 nm will be required. For this reason, development of an exposure apparatus formed by combining an apparatus to generate extreme ultraviolet (EUV) light with a wavelength of about 13 nm and a reduced projection reflective optics has been expected.

As an EUV light generation device, three kinds of apparatuses are proposed, i.e., a Laser Produced Plasma (LPP) type device using plasma generated by irradiating a target substance with a laser beam, a Discharge Produced Plasma (DPP) type device using plasma generated by discharge, and a Synchrotron Radiation (SR) type device using orbital synchrotron radiation.

CITATION LIST

Patent Literature

[Patent Literature 1] JP 2013-191699 A
[Patent Literature 2] JP 2011-31364 A
[Patent Literature 3] JP 2009-500580 A
[Patent Literature 4] JP 2015-39040 A

SUMMARY

A tank according to an aspect of the present disclosure may include: a tank main body; a lid body; a bolt; a first support portion; a second support portion; and a sealing member. The tank main body may have a space inside and having an opening in communication with the space. The lid body may cover the opening of the tank main body and a peripheral portion of the opening. The bolt may fix the tank main body and the lid body in the peripheral portion. The first support portion may be arranged to surround the opening in a region on a side of the opening with respect to the bolt to support the lid body. The second support portion may be arranged to surround the opening in a region on the opening side with respect to the first support portion between the tank main body and the lid body and may have a height lower than a height of the first support portion. The sealing member may be arranged to surround the opening in the region on the opening side with respect to the first support portion between the tank main body and the lid body.

A target generation device according to an aspect of the present disclosure may include: a tank main body; a lid body; a bolt; a first support portion; a second support portion; a sealing member; and a nozzle. The tank main body may have a space filled with molten metal therein and may have an opening in communication with the space. The lid body may cover the opening of the tank main body and a peripheral portion of the opening. The bolt may fix the tank main body and the lid body in the peripheral portion. The first support portion may be arranged to surround the opening in a region on a side of the opening with respect to the bolt to support the lid body. The second support portion may be arranged to surround the opening in the region on the opening side with respect to the first support portion between the tank main body and the lid body and may have a height lower than a height of the first support portion. The sealing member may be arranged to surround the opening in the region on the opening side with respect to the first support portion between the tank main body and the lid body. The nozzle may be connected to the tank main body and may discharge a target composed of the molten metal in the space within a chamber.

An extreme-UV-light generation device according to an aspect of the present disclosure may include: a tank main body; a lid body; a bolt; a first support portion; a second support portion; a sealing member; a nozzle; a laser device; and a collector mirror. The tank main body may have a space filled with molten metal therein and may have an opening in communication with the space. The lid body may cover the opening of the tank main body and a peripheral portion of the opening. The bolt may fix the tank main body and the lid body in the peripheral portion. The first support portion may be arranged to surround the opening in a region on a side of the opening with respect to the bolt to support the lid body. The second support portion may be arranged to surround the opening in the region on the opening side with respect to the first support portion between the tank main body and the lid body and may have a height lower than a height of the first support portion. The sealing member may be arranged to surround the opening in the region on the opening side with respect to the first support portion between the tank main body and the lid body. The nozzle may be connected to the tank main body and may discharge a target composed of the molten metal in the space within a chamber. The laser device may irradiate the target output from the nozzle with a laser beam. The collector mirror may focus and output extreme-UV-light emitted from plasma of the target generated by irradiating with the laser beam.

BRIEF DESCRIPTION OF THE DRAWINGS

Hereinafter, several embodiments of the present disclosure will be described as merely examples with reference to the accompanying drawings.

DETAILED DESCRIPTION

Figure 1:
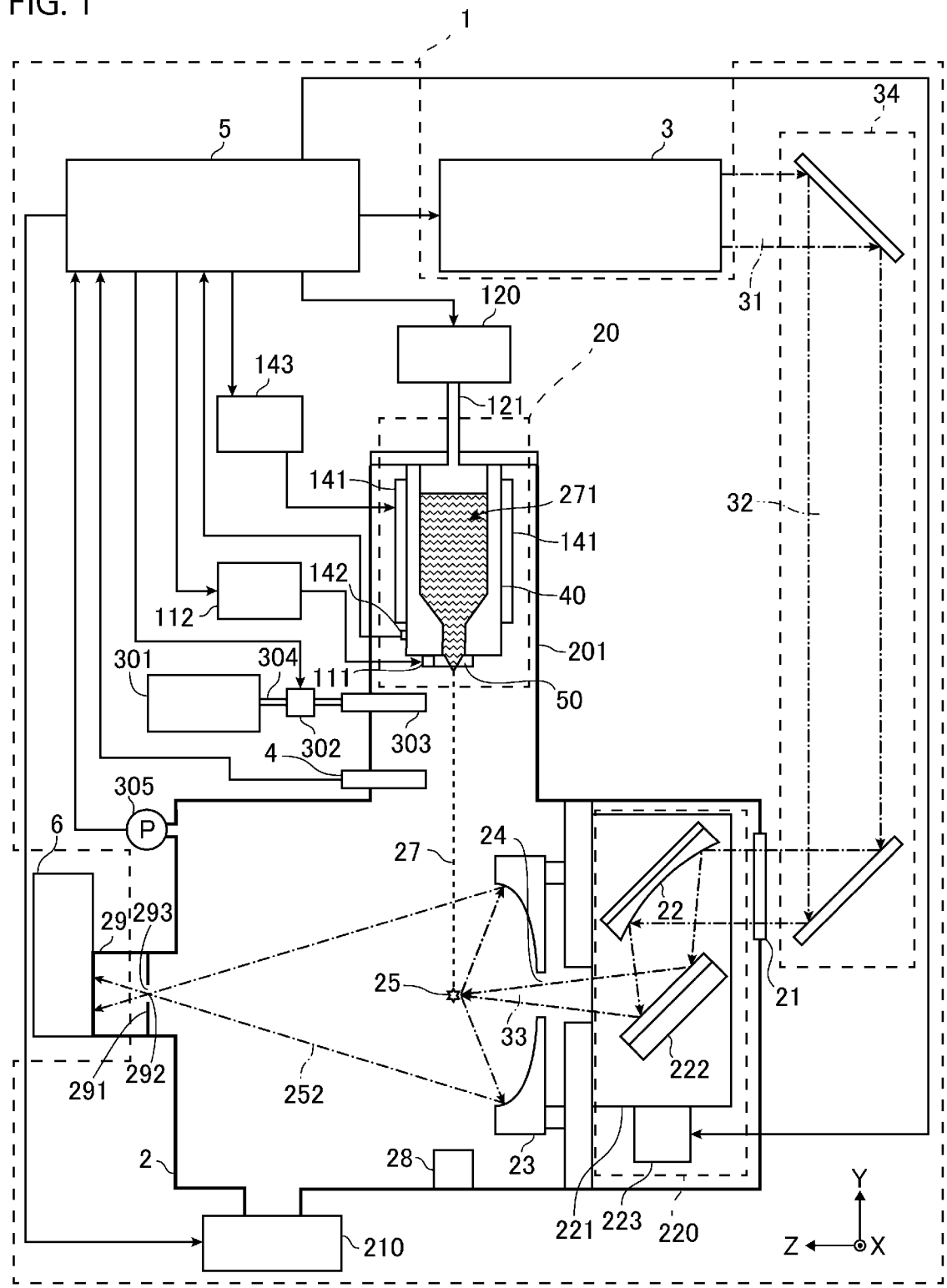
FIG. 1 is a schematic diagram showing a schematic configuration example of an EUV-light generation device according to a comparative example.

1. Overview
2. Comparative example
   2.1 Configuration
   2.2 Operation
3. First embodiment
   3.1 Configuration
   3.2 Actions and effects
4. Second embodiment
   4.1 Configuration
   4.2 Actions and effects
5. Third embodiment
   5.1 Configuration
   5.2 Actions and effects Hereinafter, embodiments of the present disclosure will be described in detail with reference to the drawings.

The embodiments to be described below are merely examples of the present disclosure and do not limit the scope of the present disclosure. Furthermore, all of the configurations and the operations described in the embodiments are not necessarily essential for the configurations and the operations of the present disclosure.

The same components are denoted with the same reference numerals, and overlapped explanations will be omitted.

1. Overview

Embodiments of the present disclosure relate to a tank, a target generation device, and an extreme-UV-light generation device. For example, the present disclosure relates to a tank, a target generation device, and an extreme-UV-light generation device capable of suppressing damages such as cracks in a tank. Hereinafter, extreme-UV-light is sometimes referred to as EUV light. Therefore, the extreme-UV-light generation device may be referred to as an EUV light generation device.

2. Comparative Example

First, a comparative examples of a tank, a target generation device, and an EUV-light generation device will be described in detail with reference to the drawings.

2.1 Configuration

FIG. 1 is a schematic diagram showing a schematic configuration example of an EUV-light generation device according to a comparative example. As shown in FIG. 1, the EUV-light generation device 1 includes a chamber 2, a laser beam direction controller 34, and a control unit 5. For this EUV-light generation device 1, a laser device 3 is usually added and used.

The chamber 2 includes a target generation device 20, a laser focusing optical system 220, an EUV collector mirror 23, a target collection unit 28, and an exhaust device 210. The laser focusing optical system 220 includes a moving plate 221 on which a laser beam collector mirror 22 and a high reflection mirror 222 are mounted, and a laser beam manipulator 223.

The target generation device 20 is provided in a sub-chamber 201 connected to the chamber 2. The target generation device 20 includes a tank 40 and a nozzle 50. The tank 40 stores therein a target material 271 made of molten metal. Examples of the target material 271 include tin, terbium, gadolinium, lithium, xenon, or a combination of any two or more thereof. The nozzle 50 outputs the target material 271 as a droplet-like target 27. Further, the inside of the tank 40 communicates with a pressure regulator 120 for adjusting the gas pressure via a pipe 121. Hereinafter, the gas pressure inside the tank 40 may be referred to as tank internal pressure.

A piezo element 111 is installed in the nozzle 50. The piezo element 111 is connected to a piezo power supply 112, and a heater 141 is connected to a heater power supply 143. A temperature sensor 142 and the heater 141 are arranged in a tank main body. The piezo power supply 112, the pressure regulator 120, the temperature sensor 142, and the heater power supply 143 are connected to the control unit 5, respectively.

The laser beam direction controller 34 includes an optical element for defining the traveling direction of the laser beam and an actuator for adjusting the position, posture, etc. of the optical element. A window 21 is provided on the wall of the chamber 2, and a pulse laser beam 32 which is output from the laser device 3 and whose traveling direction is adjusted by the laser beam direction controller 34 passes therethrough. The laser focusing optical system 220 is arranged so that a pulse laser beam 32 emitted from the laser beam direction controller 34 is incident on the laser focusing optical system 220. The laser beam manipulator 223 sets the moving plate 221 on which the laser beam collector mirror 22 and the high reflection mirror 222 are fixed to be moved in the X axis, Y axis, and Z axis directions, so that the laser focusing position in the chamber 2 becomes the position designated from the control unit 5.

The EUV collector mirror 23 has first and second focal points. On the surface of the EUV collector mirror 23, for example, a multilayer reflective film in which molybdenum and silicon are alternately laminated is formed. The EUV collector mirror 23 is preferably arranged, for example, such that its first focal point is located in the plasma generation region 25 and its second focal point is located at the intermediate focal point (IF) 292. At the central portion of the EUV collector mirror 23, a through hole 24 through which the pulse laser beam 33 passes is provided.

The EUV-light generation device 1 includes the control unit 5, a target sensor 4, and the like. The target sensor 4 has an imaging function and is configured to detect the presence, trajectory, position, speed, etc. of the target 27.

The EUV-light generation device 1 also includes a connection unit 29 for allowing communication between the inside of the chamber 2 and the inside of the exposure device 6. A wall 291 in which an aperture 293 is formed is provided inside the connection unit 29. The wall 291 is preferably arranged so that its aperture 293 is positioned at the second focal point position of the EUV collector mirror 23.

The target collection unit 28 collects the unnecessary target 27.

Further, the EUV-light generation device 1 includes a hydrogen gas supply unit 301, a flow rate regulator 302, a gas nozzle 303, and a gas pipe 304. The EUV-light generation device 1 further includes a pressure sensor 305.

The hydrogen gas supply unit 301 is connected to the gas nozzle 303 via the gas pipe 304. The hydrogen gas supply unit 301 supplies, for example, a balance gas having a hydrogen gas concentration of about 3% to the gas pipe 304. The balance gas may contain nitrogen ($N_2$) gas or argon (Ar) gas.

The gas nozzle 303 is provided in the sub-chamber 201 so that the blown hydrogen gas flows near the nozzle 50 of the target generation device 20. The flow rate regulator 302 is provided in the gas pipe 304 between the hydrogen gas supply unit 301 and the gas nozzle 303.

A cold cathode ionization vacuum gauge, a Pirani vacuum gauge, a capacitance manometer and the like are used as the pressure sensor 305. The exhaust device 210 is used as a removal device for removing moisture in the chamber 2. The pressure sensor 305 and the flow rate regulator 302 are connected to the control unit 5.

Figure 2:
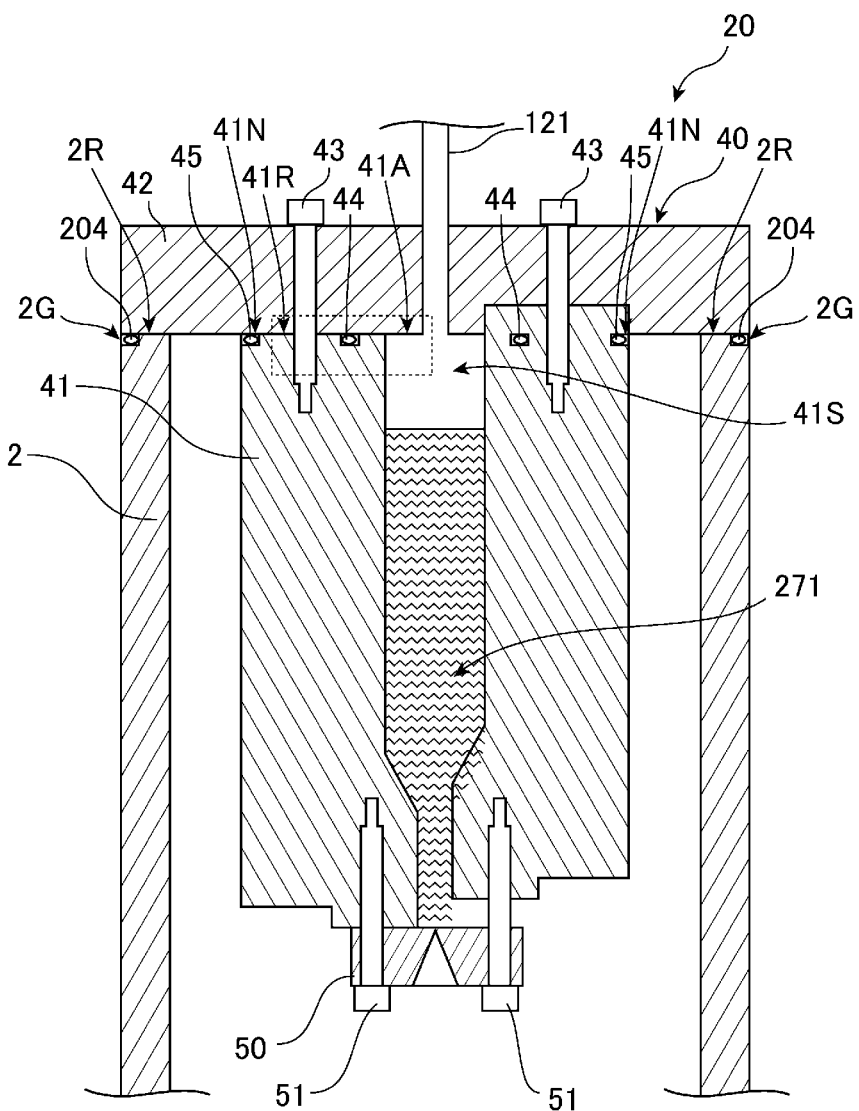
FIG. 2 shows the target generation device of FIG. 1.

Next, the tank 40 will be described in detail. FIG. 2 is an enlarged view of the target generation device 20 of FIG. 1. In the following figures, the heater 141, the temperature sensor 142, and the piezo element 111 described in FIG. 1 are omitted. The tank 40 includes a tank main body 41 and a lid body 42.

The tank main body 41 is a tubular member having a space 41S therein and having an opening 41A in communication with the space 41S above the space 41S, and in this example, the tank main body 41 is substantially cylindrical. When the target material 271 is made of tin, it is preferable that the tank main body 41 is made of, for example, molybdenum, tantalum, or tungsten, which is difficult to chemically react with tin. The peripheral portion 41R of the opening 41A, which is the end portion of the tank main body 41, serves as a part for supporting the lid body 42. The lid body 42 is a plate-shaped member whose lower surface is substantially flat, and covers the opening 41A of the tank main body 41 and the peripheral portion 41R of the opening 41A. In this example, the lid body 42 covers the opening 41A of the tank main body 41 and covers the opening of the chamber 2. The lid body 42 is fixed to the tank main body 41 by screwing a plurality of bolts 43 into the tank main body 41 in the peripheral portion 41R. The number of bolts 43 is, for example, 16. The lid body 42 is made of, for example, stainless steel. In addition, the bolts 43 are preferably made of the same material as the lid body 42, and are made of, for example, stainless steel.

Figure 3:
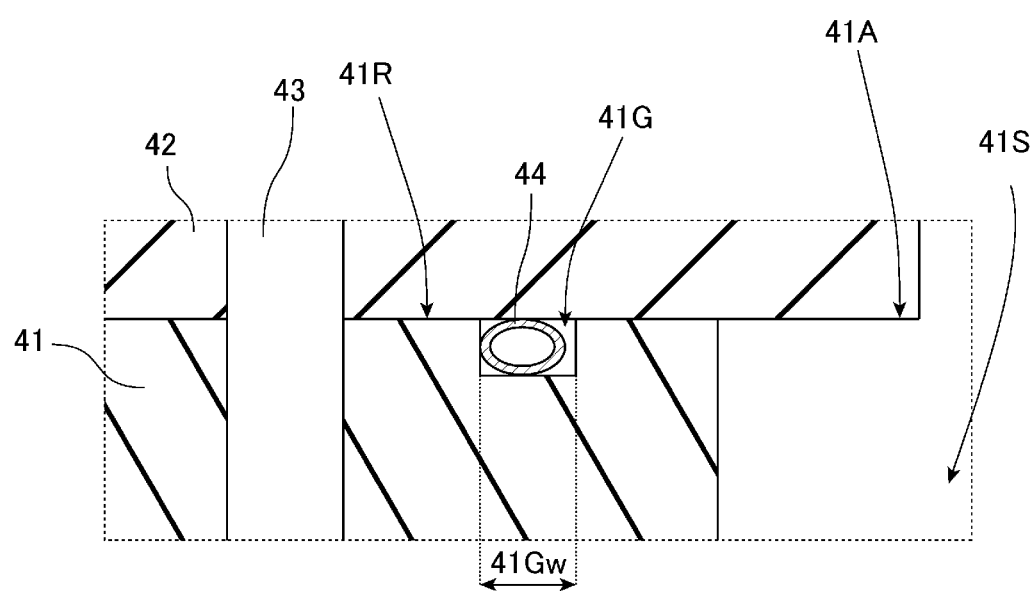
FIG. 3 is an enlarged view of a region surrounded by a broken line in FIG. 2.

FIG. 3 is an enlarged view of the region surrounded by a broken line in FIG. 2, and shows a state in which the lid body 42 is fixed with bolts 43 on the peripheral portion 41R of the tank main body 41. As shown in FIG. 3, the peripheral portion 41R of the tank main body 41 is provided with a groove 41G for arranging a sealing member to surround the opening 41A on the side of the opening 41A with respect to the bolts 43, that is, on the inner circumference side with respect to the bolts 43. Inside this groove 41G, an inner O-ring 44 as the sealing member is arranged over the entire circumference. The inner O-ring 44 is a tubular member formed in a ring shape. In this example, the inner O-ring 44 is made of a metal, for example, the inner O-ring 44 is made of a tube-like stainless steel made of silver plated on the outer surface. A width 41Gw of the groove 41G is larger than the diameter of the tube of the inner O-ring 44. The depth of the groove 41G is smaller than the diameter of the tube of the inner O-ring 44. For example, the depth of the groove 41G is 1.25 mm, and the diameter of tube of the inner O-ring 44 is 1.6 mm. Therefore, in a state where the lid body 42 is not arranged, a part of the inner O-ring 44 arranged in the groove 41G protrudes upward from the groove 41G. With the lid body 42 arranged on the peripheral portion 41R and the bolts 43 tightened, the inner O-ring 44 is deformed to be crushed by the pressing force from the lid body 42, and the inner O-ring 44 is deformed to fill the gap between the tank main body 41 and the lid body 42. The inner O-ring 44 seals the tank 40 at the inside with respect to the bolts 43. In this case, when the inner O-ring 44 is silver plated on the outer surface of the stainless steel as described above, the silver plating is slightly deformed to fill the fine gap, which is preferable. In a state where the bolts 43 are tightened and the inner O-ring 44 is deformed, an outer circumference surface of the inner O-ring 44 comes into contact with the outer wall of the groove 41G, and a gap is formed between the inner O-ring 44 and an inner wall of the groove 41G. As the outer circumference surface of the inner O-ring 44 abuts on the outer wall of the groove 41G in this manner, the inner O-ring 44 is deformed to be crushed, the spread of the inner O-ring 44 is suppressed, and the inner O-ring 44 can generate sufficient repulsive force. In order for the inner O-ring 44 to generate a sufficient repulsive force, when the diameter of the tube of the inner O-ring 44 is, for example, 1.6 mm as described above, the wall thickness of the tube is, for example, 0.35 mm.

In the peripheral portion 41R of the tank main body 41, a groove 41N for arranging the sealing member is formed to surround the opening 41A on the side opposite to the side of the opening 41A with respect to the bolts 43, that is, on the outer circumference side with respect to the bolts 43. In this groove 41N, an outer O-ring 45 as a sealing member is arranged. The configuration of the outer O-ring 45 is configured similar to the inner O-ring 44 except for the diameter, for example. The depth of the groove 41N is set to be the same as the groove 41G, for example. Accordingly, the outer O-ring 45 is deformed to be crushed in a state where the lid body 42 is arranged and the bolts 43 are tightened, filling the gap between the tank main body 41 and the lid body 42, and at the outside with respect to the bolts 43, the tank 40 is sealed.

A through hole is formed substantially at the center of the lid body 42, and the pipe 121 communicates with the through hole, and a gas path is formed. The diameter of this gas path is, for example, 8 mm. Therefore, the inside of the tank 40 is in communication with the pressure regulator 120 as described above, and the pressure regulator 120 adjusts the pressure of the space 41S of the tank main body 41.

As shown in FIG. 2, the nozzle 50 is fixed to the tank main body 41 by a plurality of bolts 51 in the lower part of the tank main body 41. A nozzle hole is formed in the nozzle 50, and the nozzle hole is in communication with the opening under the tank main body 41 so that the target material in the tank main body 41 can be output from the nozzle hole.

As shown in FIG. 2, a groove 2G for arranging a sealing member is formed in a peripheral portion 2R which is in contact with the lid body 42 of the chamber 2. In the groove 2G, a chamber O-ring 204 as a sealing member is arranged around the entire circumference. The chamber O-ring 204 is, for example, similar in shape to the inner O-ring 44 except for the diameter, and the material of the chamber O-ring 204 may be composed of a material similar to the inner O-ring 44 or may be made of resin. The chamber O-ring 204 is deformed to be crushed with the lid body 42 arranged on the peripheral portion 2R of the chamber 2 and the bolts 43 tightened, to fill the gap between the chamber 2 and the lid body 42 and seal the chamber 2.

The inside of the chamber 2 configured as described above is set to be substantially vacuum, which is set to such a degree that a gas such as hydrogen remains slightly as described later. An inactive gas such as argon is filled in the region not filled with the target material 271 in the space 41S in the tank 40. The pressure in the tank 40 is, for example, 40 MPa. Since the inside of the tank 40 is made to attain high pressure in this manner, in a state where the inner O-ring 44 is crushed by the pressing force from the lid body 42 with the tightening of the bolts 43, the inner O-ring 44 pushes back the tank main body 41 and the lid body 42 with high repulsive force so that the gas in the tank 40 is prevented from leaking.

2.2 Operation

The target generation device 20 is assembled to the chamber 2, for example, by tightening the respective bolts 43 at the time of maintenance or the like. With the target generation device 20 assembled, the control unit 5 causes the exhaust device 210 to operate in order to exhaust the atmosphere in the chamber 2. At that time, purging and exhausting in the chamber 2 may be repeated for exhaust of atmospheric constituents. For the purge gas, for example, an inert gas such as nitrogen ($N_2$) or argon (Ar) is preferably used. As a result of the exhaust by the exhaust device 210, when the chamber internal pressure becomes equal to or lower than the first predetermined pressure, the control unit 5 starts introduction of hydrogen gas into the chamber 2 from the hydrogen gas supply unit 301. Hydrogen gas is preferably introduced into the chamber 2 at a low flow rate. At this time, the control unit 5 may control the flow rate regulator 302 so that the value of the pressure sensor 305 is maintained at the second predetermined pressure. Thereafter, the control unit 5 waits until a predetermined time elapses since the introduction of hydrogen gas is started.

The control unit 5 supplies a current from the heater power supply 143 to heat the heater 141 to heat and maintain the target material 271 in the tank 40 to a predetermined temperature equal to or higher than the melting point. Further, the control unit 5 adjusts the current flow rate supplied from the heater power supply 143 to the heater 141 based on the output from the temperature sensor 142, and controls the temperature of the target material 271 to a predetermined temperature. In the case where tin is used as the target material 271, the predetermined temperature is, for example, a temperature within a temperature range of 250 degrees Celsius to 290 degrees Celsius.

The control unit 5 controls the tank internal pressure to a predetermined pressure by the pressure regulator 120 so that the melted target material 271 is output from the nozzle hole of the nozzle 50 at a predetermined speed. The target material 271 discharged from the nozzle hole may take the form of a jet.

The control unit 5 applies a voltage of a predetermined waveform to the piezo element 111 via the piezo power supply 112 in order to generate the target 27 of the target material 271. Vibration of the piezo element 111 can propagate through the nozzle 50 to the jet of the target material 271 output from the nozzle hole. The jet of the target material 271 is divided at a predetermined cycle by this vibration. Thereby, the target 27 of the target material 271 is generated, and the generated target 27 becomes a droplet.

The control unit 5 outputs a light emission trigger to the laser device 3. When the light emission trigger is input, the laser device 3 outputs a pulse laser beam 31. The output pulse laser beam 31 is incident as a pulse laser beam 32 on the laser focusing optical system 220 via the laser beam direction controller 34 and the window 21.

The control unit 5 controls the laser beam manipulator 223 so that the pulse laser beam 32 focuses in the plasma generation region 25. The target 27 in the plasma generation region 25 is irradiated with the pulse laser beam 33 converted into convergent light by the laser beam collector mirror 22. The EUV light 252 is generated from the plasma generated by this irradiation. The EUV light 252 is periodically generated by irradiating with a pulse laser beam 33 to the target 27 supplied to the plasma generation region 25 at a predetermined cycle.

The EUV light 252 generated at the plasma generation region 25 is focused at the intermediate focal point 292 by the EUV collector mirror 23 and then input to the exposure device 6 as described with reference to FIG. 1.

2.3 Problems

As described above, the pressure at the inside of the tank 40 is, for example, 40 MPa. The inner O-ring 44 sealing the inside of the tank 40 having such a high pressure may generate a large repulsive force due to collapse and deformation of the tube. Therefore, when the inner O-ring 44 collapses, the force to spread outward also increases. However, in this example, the outer circumference surface of the inner O-ring 44 abuts on the outer wall of the groove 41G which is a part of the tank main body 41. Therefore, not only the repulsive force for causing the tube of the inner O-ring 44 to return to the tank main body 41 but also the force of spreading outward due to deformation of the inner O-ring 44 is directly applied to the tank main body 41. Accordingly, unless the strength of the tank main body 41 is increased, there is a fear that the tank main body 41 may be deformed or cracked.

3. First Embodiment

Next, a tank, a target generation device, and an EUV-light generation device according to a first embodiment will be described in detail with reference to the drawings. In the following description, the configurations similar to the configurations described above are denoted with the same reference numerals, and duplicate descriptions thereabout are omitted unless otherwise it is particularly explained.

3.1 Configuration

Figure 4:
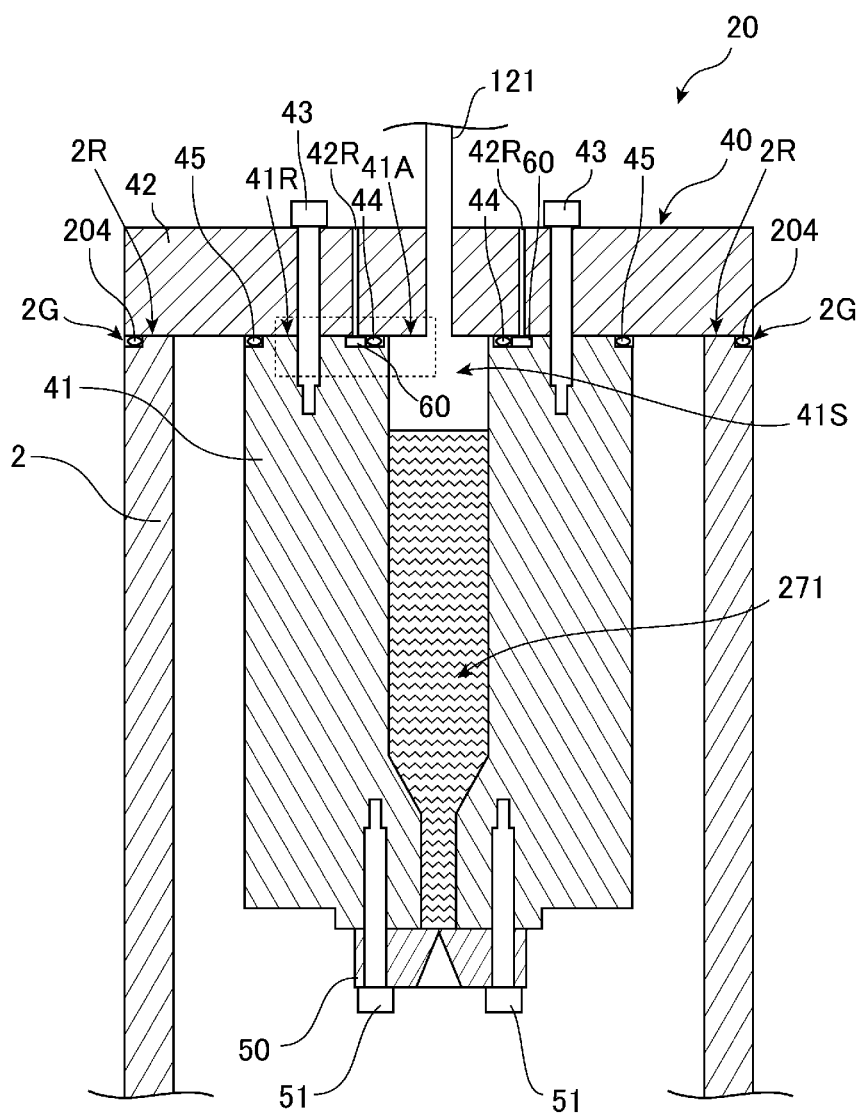
FIG. 4 is a diagram showing the target generation device according to a first embodiment.
Figure 5:
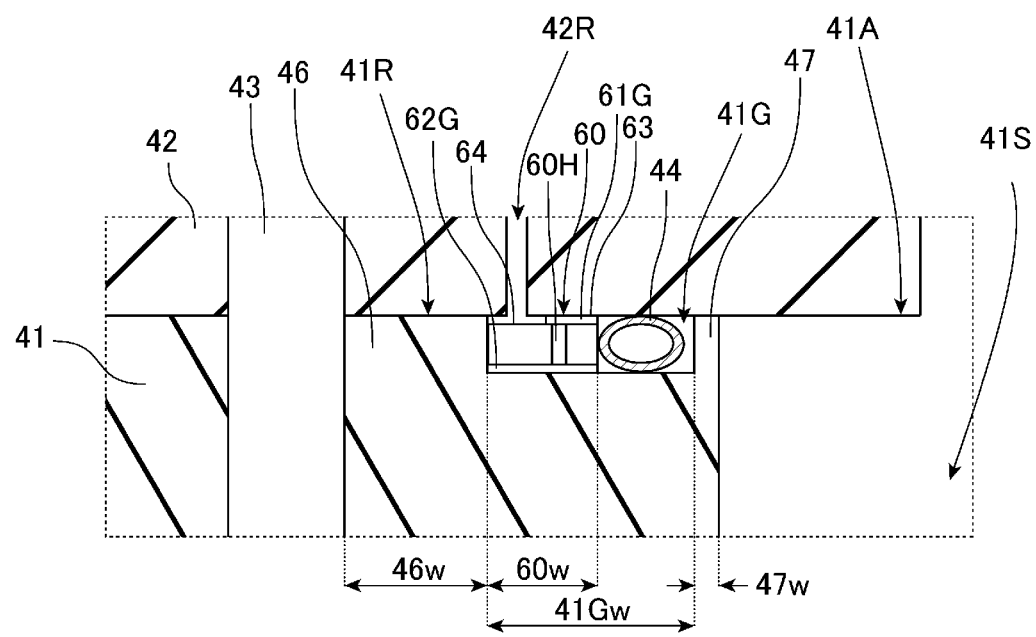
FIG. 5 is an enlarged view of a region surrounded by a broken line in FIG. 4.

FIG. 4 is a diagram showing a target generation device 20 according to this embodiment. FIG. 5 is an enlarged view of a region surrounded by a broken line in FIG. 4, and a state in which a lid body 42 is fixed with bolts 43 on a peripheral portion 41R of a tank main body 41.

Figure 6:
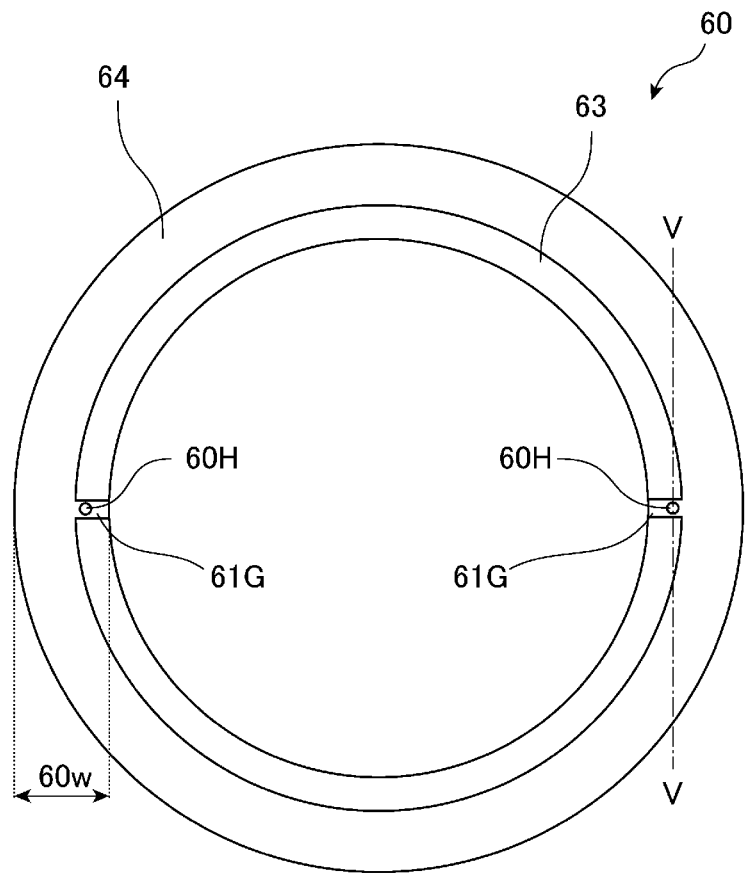
FIG. 6 shows a collar of FIG. 5.

As shown in FIG. 4 and FIG. 5, the width 41Gw of a groove 41G formed in the peripheral portion 41R of the tank main body 41 of the present embodiment is formed larger than the width 41Gw of the groove 41G in the comparative example. Furthermore, in this embodiment, a collar 60 is arranged on the outer circumference side in the groove 41G. FIG. 6 shows the collar 60. As shown in FIG. 6, the collar 60 is a circular ring member. The thickness of the collar 60 is slightly thinner than the depth of the groove 41G. For example, the collar 60 is formed thinner by about 0.1 mm than the depth of the groove 41G. For example, if the depth of the groove 41G is set to 1.25 mm as described above, the thickness of the collar 60 is set to 1.15 mm. In the present embodiment, the depth of the groove 41G is made smaller than the diameter of a tube of an inner O-ring 44 as in the case of the comparative example. Accordingly, in a state where the bolts 43 are tightened and the lid body 42 is fixed to the tank main body 41, the inner O-ring 44 is deformed to be crushed by the pressing force from the lid body 42. In this state, an outer circumference surface of the inner O-ring 44 is in contact with the inner circumference surface of the collar 60, and a gap is formed between the inner O-ring 44 and an inner wall of the groove 41G. The width of this gap is, for example, approximately about 0.2 mm.

In the tank 40 having such a configuration, when it is assumed that a circumferential portion of the tank main body 41 between the groove 41G and the plurality of bolts 43 is a first support portion 46, the height of the first support portion 46 is equivalent to the depth of the groove 41G. The first support portion 46 integral with the tank main body 41 is arranged surrounding an opening 41A to support the lid body 42 in the region on the opening 41A side with respect to the bolts 43. A width 46w of the first support portion 46 is, for example, 25 mm.

When it is assumed that the collar 60 is a second support portion, the second support portion formed separately from the tank main body 41 is arranged to surround the opening 41A in the region on the opening 41A side with respect to the first support portion 46 between the tank main body 41 and the lid body 42. The inner O-ring 44 which is a sealing member is arranged in the region on the opening 41A side with respect to the second support portion. Since the thickness of the collar 60 is equal to the height of the second support portion and the thickness of the collar 60 is made thinner than the depth of the groove 41G as described above, the second support portion has a height lower than the height of the first support portion 46. A width 60w of collar 60 which is the second support portion is larger than the thickness of collar 60, and is set to be, for example, 4.8 to 11.2 mm. Thus, for example, if the diameter of the tube of the inner O-ring 44 is 1.6 mm as described above, the width 60w of the collar 60 is, for example, 3 times or more and 7 times or less of the diameter of the tube of the inner O-ring 44 before it is deformed to be crushed. Further, in the present embodiment, the width 60w of the collar 60, which is the second support portion, is made smaller than the width 46w of the first support portion 46.

When it is assumed that a circumferential portion of the tank main body 41 between the opening 41A and the groove 41G is a third support portion 47, the height of the third support portion 47 is equal to the height of the first support portion 46. Accordingly, the third support portion 47 supports the lid body 42 together with the first support portion 46. A width 47w of the third support portion 47 is, for example, 1 to 1.15 mm, and in the present embodiment, the width 47w of the third support portion 47 is made smaller than the width 46w of the first support portion 46 and the width 60w of the collar 60.

Figure 7:
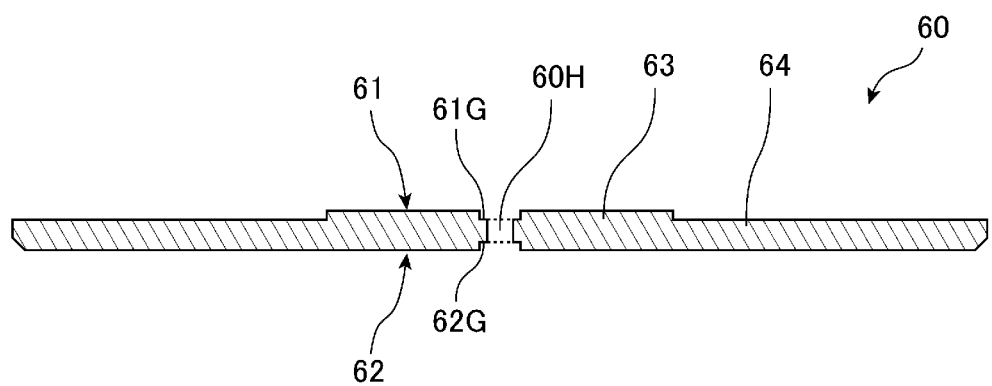
FIG. 7 is a cross-sectional view of the collar at the line V-V in FIG. 6.

Next, the collar 60 will be described in more detail. FIG. 7 is a cross-sectional view of the collar 60 taken along line V-V in FIG. 6. As shown in FIG. 6, FIG. 7, the collar 60 has a front surface 61 and a back surface 62. In the collar 60, the thickness of an inner circumferential portion 63 is larger than the thickness of an outer circumferential portion 64, and in the front surface 61, the inner circumferential portion 63 is convex than the outer circumferential portion 64, and the back surface 62 has a substantially flat structure. A plurality of grooves 61G is formed from the inner circumference side to the outer circumference side in the inner circumferential portion 63 that is made convex at the front surface. In the back surface 62, a groove 62G is formed at a position corresponding to each of the grooves 61G. In addition, a through hole 60H connecting the groove 61G and the groove 62G is formed. The collar 60 is preferably made of a material having a thermal expansion coefficient equivalent to that of the bolts 43. When the bolts 43 are made of stainless steel as described above, the collar 60 is also preferably made of stainless steel. When a target material 271 is made of tin, it is preferable that the collar 60 is made of molybdenum, tantalum, or tungsten which is difficult to chemically react with tin.

As shown in FIG. 5, in a state where the collar 60 is arranged in the groove 41G of the tank main body 41, the front surface 61 faces the side of the lid body 42 and the back surface 62 faces the bottom side of the groove 41G. In this state, the groove 61G of the collar 60 forms a path with the lid body 42, and the groove 62G forms a path with the tank main body 41. Since the thickness of the inner circumferential portion 63 of the collar 60 is larger than the thickness of an outer circumferential portion 64 as described above, there is a gap between the outer circumferential portion 64 and the lid body 42 at the front surface 61 of the collar 60. As shown in FIG. 5, a leakage check through hole 42R is formed in the lid body 42. The leakage check through hole 42R is formed at a position at least partially overlapping with the collar 60 in the thickness direction of the lid body 42, and in the present embodiment, the leakage check through hole 42R overlaps at least partly with the outer circumferential portion 64. Therefore, the leakage check through hole 42R is connected to the gap between the outer circumferential portion 64 and the lid body 42. The groove 61G is connected to the leakage check through hole 42R through the gap. As described above, the groove 61G and the groove 62G are connected by the through hole 60H. Therefore, a path formed of groove 61G, a path formed of through hole 60H, and a path formed of groove 62G connect the leakage check through hole 42R of the lid body 42 and the space on the inner circumference surface side of the collar 60.

The tank 40 according to this embodiment has a different structure from the tank 40 of the comparative example as described above. Further, the configurations of the target generation device 20 and the EUV-light generation device 1 according to this embodiment are similar to the comparative example except for the structural difference of the tank 40.

3.2 Actions and Effects

In the present embodiment, when the lid body 42 is fixed to the tank main body 41 with the bolts 43, the inner O-ring 44 as the sealing member is deformed to be crushed by the pressing force from the lid body 42. At this time, the outer circumference surface of the inner O-ring 44 abuts on the inner circumference surface of the collar 60, and the inner O-ring 44 is prevented from spreading to the outside by the collar 60. Accordingly, the collar 60 receives a force to expand outward from the inner O-ring 44. In the present embodiment, since the collar 60, which is a separate body from the tank main body 41, receives a force from the inner O-ring 44, the stress transmitted from the inner O-ring 44 to the tank main body 41 can be eased. On the contrary, in the tank 40 of the comparative example, when the inner O-ring 44 is deformed to be crushed when the lid body 42 is fixed to the tank main body 41, the outer circumference surface of the inner O-ring 44 directly contacts the tank main body 41. Therefore, in the tank 40 of the comparative example, the stress from the inner O-ring 44 may directly be transferred to the tank main body 41, possibly damaging the tank main body 41. As described above, according to the tank 40 of the present embodiment, the collar 60, which is a separate body from the tank main body 41, receives a force from the inner O-ring 44, so that damage such as cracks are prevented from occurring in the tank main body 41.

The configuration of the tank 40 having such an effect will be briefly explained as follows; the tank 40 has the tank main body 41 having the space 41S therein and having the opening 41A communicating with the space 41S, the lid body 42 covering the opening 41A of the tank main body 41 and the peripheral portion of the opening 41A, the inner O-ring 44 as the sealing member arranged to surround the opening 41A between the tank main body 41 and the lid body 42, and the collar 60, separate from the tank main body 41, surrounding the outer periphery of the inner O-ring 44 and abutting on the outer circumference surface of the inner O-ring 44.

In the present embodiment, the width 60w of the collar 60 is set to 3 times or more and 7 times or less of the diameter of the tube of the inner O-ring 44. Therefore, it is possible to further reduce the force received by the collar 60 from the inner O-ring 44 and transmitted to the tank main body 41.

In the tank 40 according to the present embodiment, the first support portion 46 is arranged surrounding the opening 41A in the region on the opening 41A side with respect to the bolts 43 to support the lid body 42. Further, the collar 60 as a second support portion having a height lower than the height of the first support portion 46 is arranged to surround the opening 41A in the region on the opening 41A side with respect to the first support portion 46 between the tank main body 41 and the lid body 42. In addition, the inner O-ring 44 which is the sealing member is arranged to surround the opening 41A in the region on the opening 41A side with respect to the first support portion 46 between the tank main body 41 and the lid body 42. With such a configuration, the lid body 42 can be supported by the first support portion 46 on the side closer to the bolts 43 than in the case where the collar 60 as the second support portion supports the lid body 42. Therefore, it is possible to suppress the deformation of the lid body 42 due to the stress applied to the lid body 42 by the tightening force of the bolts 43.

In the tank 40 of the present embodiment, the leakage check through hole 42R is formed in the lid body 42 as described above. The path connecting the leakage check through hole 42R and the space on the inner circumference surface side of the collar 60 is formed in the collar 60. The inner O-ring 44 which is a sealing member is arranged on the inner circumference side of the collar 60. Therefore, a gas such as helium is injected from the leakage check through hole 42R while the inside of the tank 40 being vacuum, and observation is performed with a gas detector. As a result, it is possible to grasp the state of sealing by the inner O-ring 44. The position where the gas detector is provided is not particularly limited as long as it is a position linked with the space 41S of the tank 40. In the present embodiment, as described above, the thickness of the outer circumferential portion 64 of the collar 60 is smaller than the thickness of the inner circumferential portion 63. A gap is formed between the outer circumferential portion 64 and the lid body 42. Therefore, even if the leakage check through hole 42R and the path are not aligned in the radial direction of the collar 60, the path can connect the leakage check through hole 42R and the space on the inner circumference side of the collar 60.

In the present embodiment, the third support portion 47 is provided. The third support portion 47 suppresses the contact between the target material 271 made of molten metal and the inner O-ring 44. Therefore, even when the materials cause chemical reaction between the target material 271 and the inner O-ring 44, the third support portion 47 can suppress the inner O-ring 44 from chemically reacting with the target material 271. Moreover, in the present embodiment, the third support portion 47 has a height higher than the height of the collar 60 which is the second support portion. Therefore, the contact between the target material 271 and the inner O-ring 44 is further suppressed. Further, the height of the third support portion 47 is the same as the height of the first support portion 46, and the third support portion 47 is in contact with the lid body 42. Therefore, the contact between the target material 271 and the inner O-ring 44 is further suppressed.

4. Second Embodiment

Next, a tank, a target generation device, and an EUV-light generation device 1 according to a second embodiment will be described in detail with reference to the drawings. In the following description, configurations similar to the configurations described above are denoted with the same reference numerals, and duplicate descriptions thereabout are omitted unless otherwise it is particularly explained.

4.1 Configuration

Figure 8:
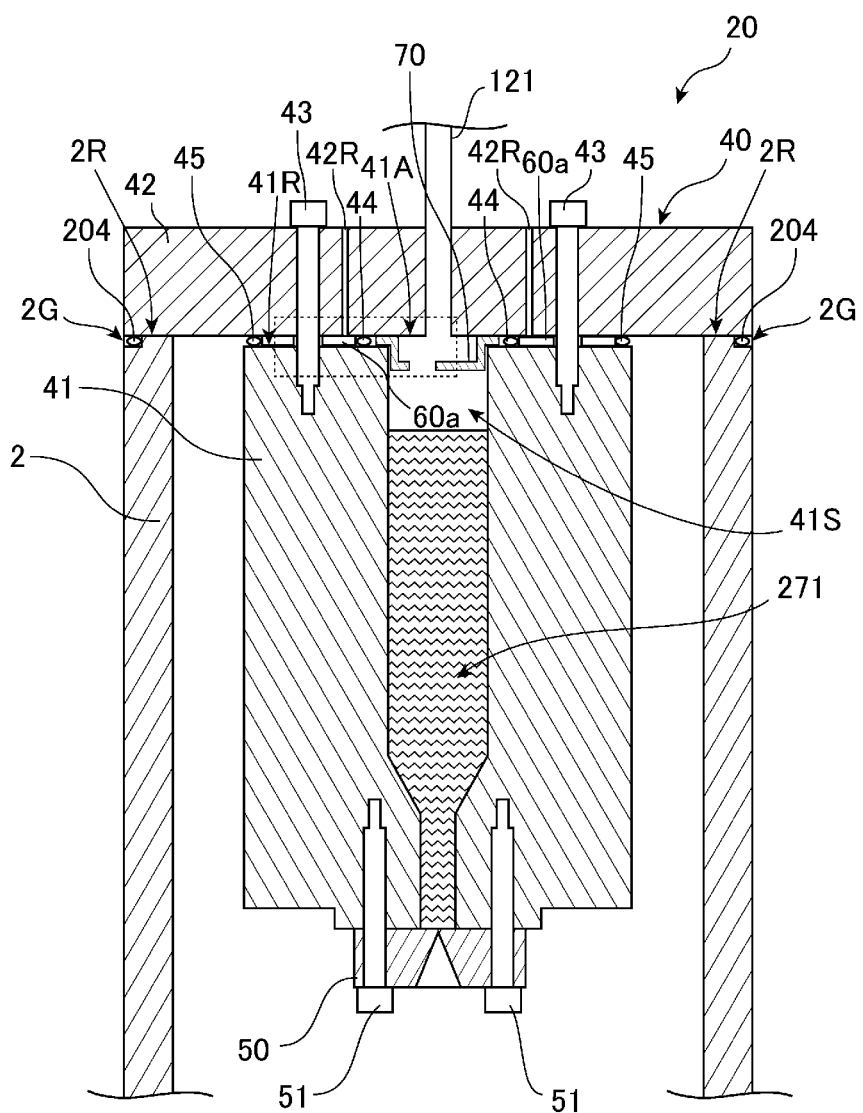
FIG. 8 is a diagram showing a target generation device according to a second embodiment.
Figure 9:
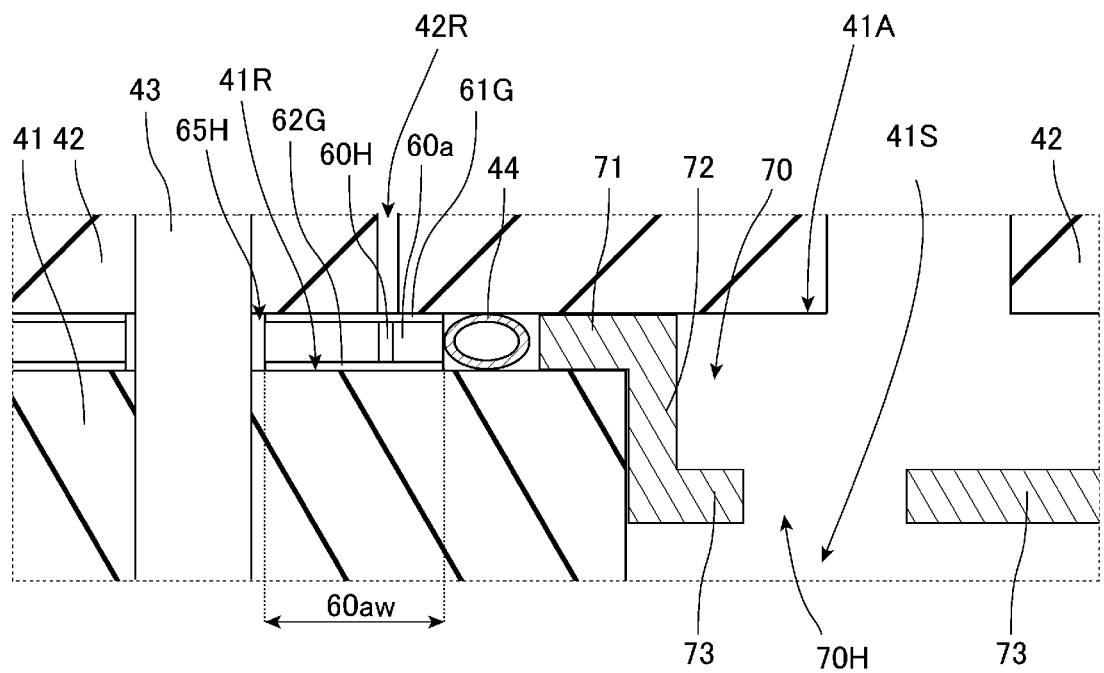
FIG. 9 is an enlarged view of a region surrounded by a broken line in FIG. 8.

FIG. 8 is a diagram showing a target generation device 20 according to the present embodiment. FIG. 9 is an enlarged view of a region surrounded by a broken line in FIG. 8, and shows a state in which a lid body 42 is fixed with bolts 43 on a peripheral portion 41R of a tank main body 41.

As shown in FIG. 8 and FIG. 9, the peripheral portion 41R of the tank main body 41 according to the present embodiment is planar, and the groove 41G formed in the peripheral portion 41R in the comparative example and the first embodiment is not formed. Furthermore, in the present embodiment, a collar 60a is arranged on the peripheral portion 41R. The collar 60a according to the present embodiment is provided from the inside to the outside with respect to the bolts 43 and is different from the collar 60 of the first embodiment in that through holes 65H are formed at the positions where the bolts 43 are inserted. Since the collar 60a is arranged on the flat peripheral portion 41R, the lid body 42 is supported by the collar 60a. The thickness of the collar 60a is made smaller than the diameter of a tube of an inner O-ring 44. Accordingly, in this embodiment, as in the first embodiment, in a state where the bolts 43 are tightened and the lid body 42 is fixed to the tank main body 41, the inner O-ring 44 is deformed to be crushed by the pressing force from the lid body 42. In this state, an outer circumference surface of the inner O-ring 44 is in contact with an inner circumference surface of the collar 60a.

A leakage check through hole 42R in this embodiment is formed at a position at least partially overlapping with the collar 60a in the thickness direction of the lid body 42. More specifically, the leakage check through hole 42R is formed at a position at least partially overlapping with a through hole 60H in the thickness direction of the lid body 42. In the present embodiment, since the bolts 43 are inserted into the through holes 65H as described above, the rotation of the collar 60 in the circumferential direction is suppressed. Therefore, this suppresses shifting of the relative position between the leakage check through hole 42R and the through hole 60H of the collar 60a.

In the present embodiment, a cover 70 is further provided. The cover 70 includes a holding part 71, a pendent part 72, and a cover part 73. The holding part 71 is the outermost portion of the cover 70 and is arranged on the peripheral portion 41R, and the holding part 71 holds the cover 70 so that it does not fall. The thickness of the holding part 71 is made smaller than the thickness of the collar 60a, and is made thinner by, for example, about 0.1 mm than the thickness of the collar 60a. Further, a gap is formed between an outer circumference surface of the holding part 71 and an inner surface of the inner O-ring 44. The pendent part 72 is connected to the holding part 71 and extends in a direction perpendicular to the radial direction of the lid body 42, and is in the space 41S of the tank main body 41. The cover part 73 covers the space 41S. In the cover part 73, a gas passage through hole 70H is formed at a position deviated from the center of an opening 41A. As described above, substantially at the center, the lid body 42 is formed with a through hole through which a pipe 121 which is a gas path passes. The position of this gas path overlaps with the approximate center of the opening 41A. Therefore, the gas passage through hole 70H formed in the cover 70 is positioned so as not to overlap with the gas path formed in the lid body 42. In addition, the size of the gas passage through hole 70H is set to be equal to or larger than the size of the gas path formed in the lid body 42. For example, when the diameter of the gas path in the lid body 42 is 8 mm, the diameter of the gas passage through hole 70H formed in the cover 70 is 10 mm. The cover 70 having such a configuration is formed from a material that does not react with a target material 271 made of molten metal. For example, when the target material 271 is tin, the cover 70 is preferably made of molybdenum, tantalum, or tungsten.

In the tank 40 having such a configuration, when it is assumed that the collar 60a is a first support portion, the first support portion separate from the tank main body 41 is arranged surrounding the opening 41A in the region on the opening 41A side with respect to the bolts 43 to support the lid body 42.

When it is assumed that the holding part 71 of the cover 70 is a second support portion, the second support portion separate from the tank main body 41 is arranged to surround the opening 41A in the region on the opening 41A side with respect to the first support portion between the tank main body 41 and the lid body 42. In this case, in the present embodiment, the inner O-ring 44 which is a sealing member is arranged in the region between the first support portion and the second support portion. The thickness of the collar 60a is the height of the first support portion. As described above, the thickness of the holding part 71 is made thinner than the thickness of the collar 60a. Accordingly, the second support portion has a height lower than the height of the first support portion. A width 60aw from the inner circumference surface of the collar 60a to the through holes 65H for inserting the bolts 43 is made larger than the thickness of the collar 60a and is set to 3 times or more and 7 times or less of the diameter of the tube of the inner O-ring 44.

4.2 Actions and Effects

As described above, also in this embodiment as in the first embodiment, when the lid body 42 is fixed to the tank main body 41 with the bolts 43, the pressing force from the lid body 42 causes the O-ring 44 as the sealing member to be deformed and crushed. At this time, the outer circumference surface of the inner O-ring 44 abuts on the inner circumference surface of the collar 60a, and the inner O-ring 44 is prevented from spreading outward due to the collar 60a. Accordingly, the collar 60a receives a force to expand outward from the inner O-ring 44. However, as in the first embodiment, the collar 60a, which is a separate body from the tank main body 41, receives a force from the inner O-ring 44, so that the stress transmitted from the inner O-ring 44 to the tank main body 41 can be alleviated. Moreover, in the present embodiment, the peripheral portion 41R of the tank main body 41 where the collar 60a is arranged is flat. Therefore, even when the collar 60a expands to the outer circumference side due to the force caused by expansion of the inner O-ring 44, the collar 60a can further restrain stress from being applied to the tank main body 41. Therefore, according to the tank 40 of the present embodiment, occurrence of damage such as cracks in the tank main body 41 can be further suppressed.

In the tank 40 of the present embodiment, the collar 60a, which is the first support portion, is arranged surrounding the opening 41A in the region on the opening 41A side with respect to the bolts 43 to support the lid body 42. Furthermore, the holding part 71 of the cover 70 serving as the second support portion having a height lower than the height of collar 60a which is the first support portion is arranged to surround the opening 41A in the region on the opening 41A side with respect to the collar 60a which is the first support portion between the tank main body 41 and the lid body 42. Still further, the inner O-ring 44 which is the sealing member is arranged to surround the opening 41A in the region on the opening 41A side with respect to the collar 60a between the tank main body 41 and the lid body 42. With such a configuration, the lid body 42 can be supported by the collar 60a as the first support portion on the side closer to the bolts 43 than in the case where the holding part 71 as the second support portion supports the lid body 42. Therefore, similarly to the first embodiment, deformation of the lid body 42 due to the stress applied to the lid body 42 by the fastening force by the bolts 43 can be suppressed.

In the present embodiment, the inner O-ring 44 which is the sealing member is arranged between the collar 60a which is the first support portion supporting the lid body 42 and the holding part 71 which is the second support portion. Therefore, the target material 271 made of molten metal can be prevented from coming into contact with the inner O-ring 44 by the second support portion without having the third support portion as in the first embodiment. Moreover, in the present embodiment, the cover part 73 of the cover 70 covers the space 41S of the tank main body 41. Therefore, even when the target material 271 made of molten metal scatters, the cover part 73 can suppress the scattering of the molten metal beyond the cover part 73, and can efficiently suppress the molten metal from coming in contact with the inner O-ring 44.

In the present embodiment, the gas passage through hole 70H formed in the cover part 73 as described above is formed at a position deviated from the center position of the opening 41A of the tank main body 41. Therefore, the tank 40 can be inclined with respect to the vertical direction so that the gas passage through hole 70H is at the upper side with respect to the axis passing through the center of the opening 41A, that is, on the side opposite to the gravity direction. When the tank 40 is tilted in this manner, a liquid surface of the target material 271 which is a molten metal can be kept away from the gas passage through hole 70H. In this case, even when the target material 271 is scattered, the target material 271 can be suppressed from passing through the gas passage through hole 70H, and can more effectively suppress the molten metal from coming into contact with the inner O-ring 44.

In the present embodiment, the gas passage through hole 70H formed in the cover part 73 is formed in a position not overlapping with the gas path formed in the lid body 42. Therefore, when a gas such as argon or nitrogen is filled from the gas path, the gas is prevented from intruding straight into the space 41S of the tank 40 from the gas path by the cover part 73. That is, the momentum of the gas flow is suppressed by cover part 73. Therefore, it is possible to suppress the scattering of the target material 271 made of molten metal by the gas introduced into the space 41S.

In the present embodiment, the cross section area of the gas passage through hole 70H is larger than the cross section area of the gas path formed in the lid body 42. Therefore, although the momentum of the gas introduced into the space 41S can be suppressed as described above, an increase in resistance of gas introduction can be suppressed.

5. Third Embodiment

Next, a tank, a target generation device, and an EUV-light generation device 1 according to a third embodiment will be described in detail with reference to the drawings. In the following description, configurations similar to the configurations described above are denoted by the same reference numerals, and duplicate descriptions thereabout are omitted unless otherwise it is particularly explained.

5.1 Configuration

Figure 10:
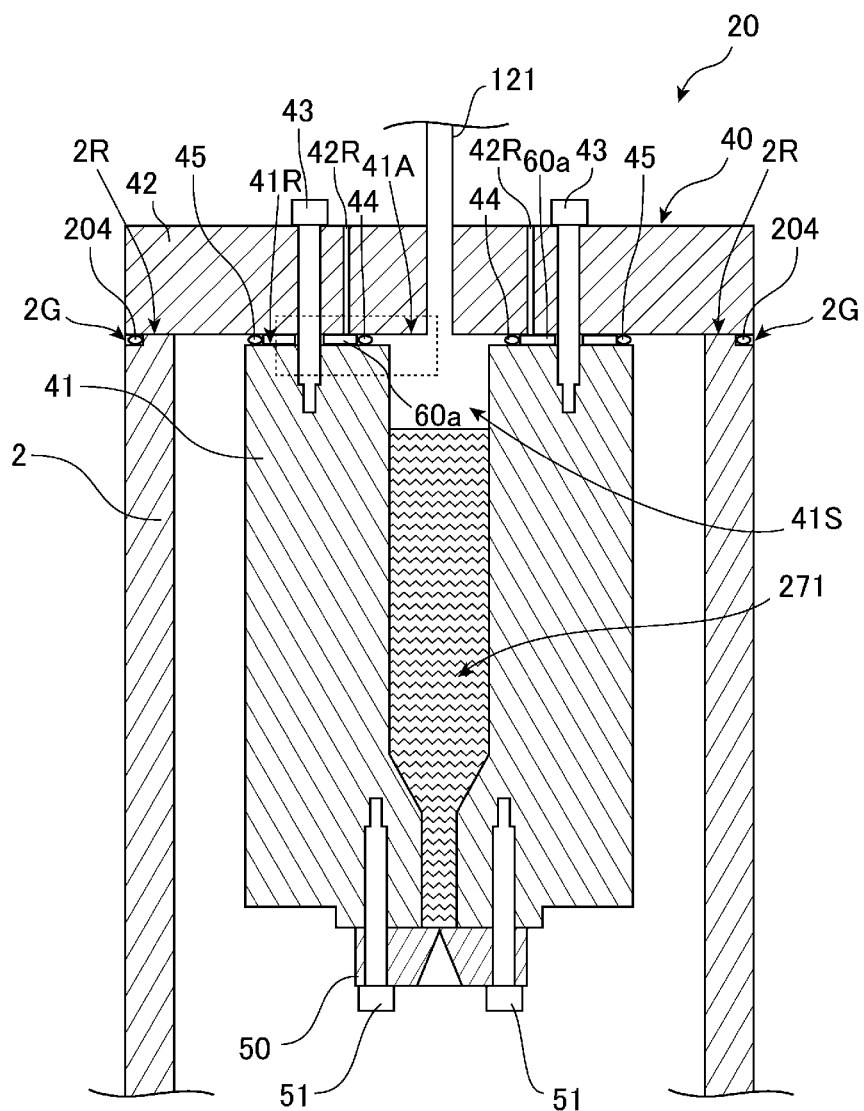
FIG. 10 shows a target generation device according to a third embodiment.
Figure 11:
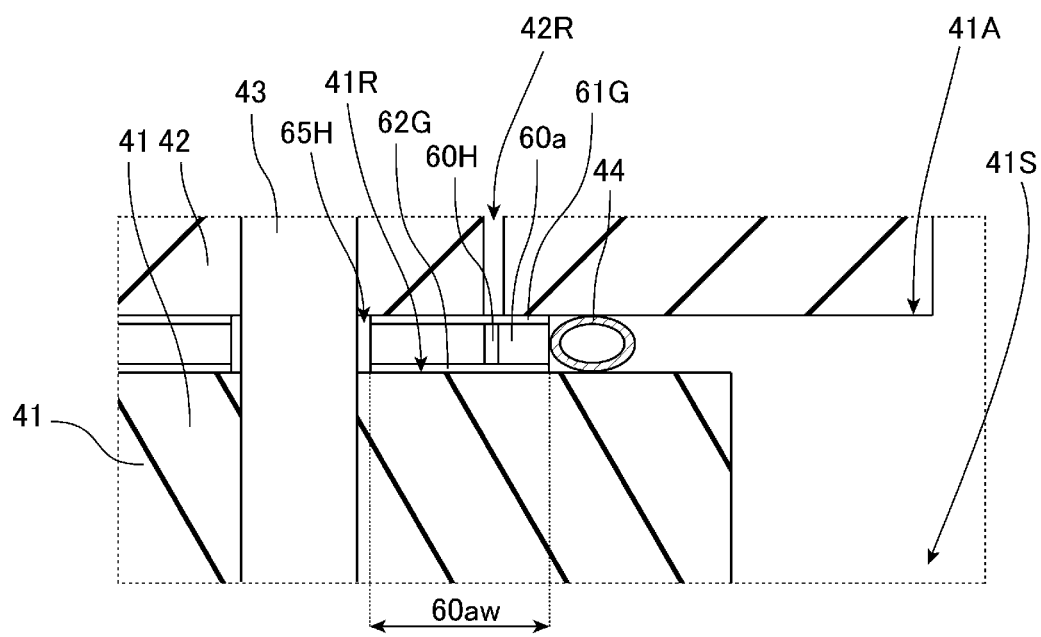
FIG. 11 is an enlarged view of a region surrounded by a broken line in FIG. 10.

FIG. 10 is a diagram showing the target generation device 20 according to this embodiment. FIG. 11 is an enlarged view of a region surrounded by a broken line in FIG. 10, and shows a state in which a lid body 42 is fixed with bolts 43 on a peripheral portion 41R of a tank main body 41.

As shown in FIG. 10 and FIG. 11, the tank 40 of the present embodiment is different from the tank 40 of the second embodiment in that the tank 40 of the present embodiment does not include the cover 70. Therefore, in the tank 40 of this embodiment, a target material 271 made of molten metal is more likely to come into contact with an inner O-ring 44 which is a sealing member, as compared with the tank 40 of the second embodiment. Therefore, a surface of the inner O-ring 44 of the present embodiment is made of a material that does not chemically react with the target material 271. For example, if the target material 271 is tin, the surface of the inner O-ring 44 is made of molybdenum, tantalum, or tungsten. It is more preferable that the inner O-ring 44 as a whole is made of a material that does not chemically react with the target material 271.

5.2 Actions and Effects

Also in this example, stress applied from the collar 60a to the tank main body 41 can be suppressed. Therefore, according to the tank 40 of the present embodiment, occurrence of damage such as cracks in the tank main body 41 can be suppressed.

According to the tank 40 of this embodiment, it is possible to omit a member for suppressing contact between the inner O-ring 44 as the sealing member and the target material 271. Therefore, the configuration of the tank 40 can be simplified.

The sealing member of the first and second embodiments is also preferably made of a material which does not chemically react with the target material 271 as in the present embodiment.

Although the present invention has been described by way of examples of the above embodiments, the present invention is not limited to these embodiments.

Figure 12A:
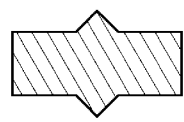
FIG. 12A is a view showing an example of a cross section of a gasket that can be used as a sealing member.
Figure 12B:
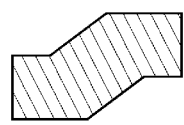
FIG. 12B is a view showing an example of a cross section of another gasket that can be used as a sealing member.
Figure 12C:
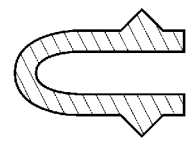
FIG. 12C is a view showing an example of a cross section of yet another gasket that can be used as a sealing member.
Figure 12D:
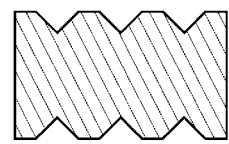
FIG. 12D is a view showing an example of a cross section of yet another gasket that can be used as a sealing member.

For example, in the above embodiments, the O-ring in which a tube is formed in a ring shape is used as the sealing member. However, the present invention is not limited thereto. FIG. 12A is a view showing an example of a cross section of a gasket that can be used as the sealing member. A metal gasket having such a cross section may be formed in a ring shape and used as the sealing member. FIG. 12B shows an example of a cross section of another gasket that can be used as the sealing member. A metal gasket having such a cross section may be formed in a ring shape and used as the sealing member. FIG. 12C is a view showing an example of a cross section of yet another gasket which can be used as the sealing member. A metal gasket having such a cross section may be formed in a ring shape and used as the sealing member. FIG. 12D is a view showing an example of a cross section of yet another gasket which can be used as the sealing member. A metal gasket having such a cross section may be formed in a ring shape and used as the sealing member. A surface of the gasket shown in FIGS. 12A to 12D is preferably made of a material that does not chemically react with the target material 271. For example, when the target material 271 is tin, the surface of the gasket is preferably made of molybdenum, tantalum, or tungsten. In this way, members other than O-rings can be used as the sealing member.

The above description is presented by way of examples without any limitations. Accordingly, various modifications to the embodiments according to the present disclosure will become apparent to those skilled in the art without departing from the scope of the appended claims.

The terms used in the specification and the appended claims should be interpreted as "non-limiting" terms. For example, the terms "include" or "be included" should be interpreted as "including the stated elements but not limited to the stated elements". The term "have" should be interpreted as "having the stated elements but not limited to the stated elements". Furthermore, the indefinite article "one" (a/an) used in the specification and the appended claims should be interpreted as "at least one" or "one or more".

REFERENCE SIGNS LIST

1 . . . extreme-UV-light generation device
2 . . . chamber
3 . . . laser device
5 . . . control unit
25 . . . plasma generation region
20 . . . target generation device
27 . . . target
34 . . . laser beam direction controller
40 . . . tank
41 . . . tank main body
42 . . . lid body
50 . . . nozzle
60 . . . collar
60a . . . collar
70 . . . cover

What is claimed is:

1. A tank comprising:
a tank main body having a space inside and having an opening in communication with the space;
a lid body covering the opening of the tank main body and a peripheral portion of the opening;
a bolt for fixing the tank main body and the lid body in the peripheral portion;
a first support portion arranged to surround the opening in a region on a side of the opening with respect to the bolt to support the lid body;
a second support portion arranged to surround the opening in a region on the opening side with respect to the first support portion between the tank main body and the lid body and having a height lower than a height of the first support portion; and
a sealing member arranged to surround the opening in the region on the opening side with respect to the first support portion between the tank main body and the lid body, wherein
the sealing member is arranged in the region on the opening side with respect to the second support portion,
the first support portion is made integrally with the tank main body, and
the second support portion is made separately from the tank main body.

2. The tank according to claim 1, wherein the sealing member is an O-ring,
an outer circumferential portion of the O-ring being in contact with an inner circumferential portion of the second support portion.

3. The tank according to claim 2, wherein an outer circumferential portion of the second support portion is in contact with an inner circumferential portion of the first support portion.

4. The tank according to claim 1, further comprising a third support portion arranged to surround the opening in the region on the opening side with respect to the sealing member between the tank main body and the lid body.

5. The tank according to claim 4, wherein the third support portion has a height higher than a height of the second support portion.

6. The tank according to claim 4, wherein a gap is formed between the third support portion and the sealing member.

7. The tank according to claim 1, wherein the lid body is formed with a through hole,
the second support portion is formed with a path connecting the through hole and a space on an inner circumference surface side of the second support portion.

8. A tank comprising:
a tank main body having a space inside and having an opening in communication with the space;
a lid body covering the opening of the tank main body and a peripheral portion of the opening;
a bolt for fixing the tank main body and the lid body in the peripheral portion;
a first support portion arranged to surround the opening in a region on a side of the opening with respect to the bolt to support the lid body;
a second support portion arranged to surround the opening in a region on the opening side with respect to the first support portion between the tank main body and the lid body and having a height lower than a height of the first support portion; and
a sealing member arranged to surround the opening in the region on the opening side with respect to the first support portion between the tank main body and the lid body, wherein
the sealing member is arranged in a region between the first support portion and the second support portion, and
the first support portion is made separately from the tank main body.

9. The tank according to claim 8, wherein the second support portion is made separately from the tank main body.

10. The tank according to claim 9, wherein a gas path through which gas to be filled in the space passes is formed in the lid body,
the tank further comprises a cover covering the opening and formed with a gas passage through hole where the gas passes at a position not overlapping with the gas path, and
the second support portion and the cover are connected.

11. The tank according to claim 10, wherein the gas passage through hole is formed at a position deviated from a center position of the opening.

12. The tank according to claim 10, wherein cross section area of the gas passage through hole is larger than cross section area of the gas path.

13. The tank according to claim 8, wherein the lid body is formed with a through hole, and
the first support portion is formed with a path connecting the through hole and a space on an inner circumference surface side of the first support portion.

14. A tank comprising:
a tank main body having a space inside and having an opening in communication with the space;
a lid body covering the opening of the tank main body and a peripheral portion of the opening;
a bolt for fixing the tank main body and the lid body in the peripheral portion;
a first support portion arranged to surround the opening in a region on a side of the opening with respect to the bolt to support the lid body;
a second support portion arranged to surround the opening in a region on the opening side with respect to the first support portion between the tank main body and the lid body and having a height lower than a height of the first support portion; and
a sealing member arranged to surround the opening in the region on the opening side with respect to the first support portion between the tank main body and the lid body, wherein
a surface of the sealing member is made of a material that does not chemically react with molten metal filled in the space.

15. A target generation device comprising:
a tank main body having a space filled with molten metal therein and having an opening in communication with the space;
a lid body covering the opening of the tank main body and a peripheral portion of the opening;
a bolt for fixing the tank main body and the lid body in the peripheral portion;
a first support portion arranged to surround the opening in a region on a side of the opening with respect to the bolt to support the lid body;
a second support portion arranged to surround the opening in the region on the opening side with respect to the first support portion between the tank main body and the lid body and having a height lower than a height of the first support portion;
a sealing member arranged to surround the opening in the region on the opening side with respect to the first support portion between the tank main body and the lid body; and
a nozzle connected to the tank main body for discharging a target composed of the molten metal in the space within a chamber.

16. An extreme-UV-light generation device comprising:
a tank main body having a space filled with molten metal therein and having an opening in communication with the space;
a lid body covering the opening of the tank main body and a peripheral portion of the opening;
a bolt for fixing the tank main body and the lid body in the peripheral portion;
a first support portion arranged to surround the opening in a region on a side of the opening with respect to the bolt to support the lid body;
a second support portion arranged to surround the opening in the region on the opening side with respect to the first support portion between the tank main body and the lid body and having a height lower than a height of the first support portion;
a sealing member arranged to surround the opening in the region on the opening side with respect to the first support portion between the tank main body and the lid body;
a nozzle connected to the tank main body for discharging a target composed of the molten metal in the space within a chamber;
a laser device that irradiates the target output from the nozzle with a laser beam; and a collector mirror that focuses and outputs extreme-UV-light emitted from plasma of the target generated by irradiating with the laser beam.

* * * * *